United States Patent
Uota et al.

(10) Patent No.: US 9,007,736 B2
(45) Date of Patent: Apr. 14, 2015

(54) POWER MODULE

(75) Inventors: Shiori Uota, Tokyo (JP); Takahiro Inoue, Tokyo (JP); Koji Tamaki, Fukuoka (JP); Shoichi Orita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 316 days.

(21) Appl. No.: 13/267,224

(22) Filed: Oct. 6, 2011

(65) Prior Publication Data

US 2012/0224288 A1 Sep. 6, 2012

(30) Foreign Application Priority Data

Mar. 4, 2011 (JP) ................................ 2011-047250

(51) Int. Cl.
*H02H 3/00* (2006.01)
*H03K 17/18* (2006.01)
*H03K 17/082* (2006.01)

(52) U.S. Cl.
CPC ............ *H03K 17/18* (2013.01); *H03K 17/0828* (2013.01); *H03K 2217/0027* (2013.01)

(58) Field of Classification Search
USPC .......................................................... 361/79
See application file for complete search history.

(56) References Cited

U.S. PATENT DOCUMENTS

| 5,008,586 | A | | 4/1991 | Miyazaki et al. |
| 5,432,471 | A | * | 7/1995 | Majumdar et al. ............ 327/380 |
| 5,608,595 | A | * | 3/1997 | Gourab et al. .................. 361/79 |
| 6,194,884 | B1 | * | 2/2001 | Kesler et al. .................. 323/285 |
| 6,717,785 | B2 | * | 4/2004 | Fukuda et al. ................ 361/93.1 |
| 7,151,401 | B2 | * | 12/2006 | Inoue ............................. 327/434 |
| 7,548,403 | B2 | | 6/2009 | Nagata et al. |
| 8,537,515 | B2 | * | 9/2013 | Inoue et al. ...................... 361/90 |
| 2001/0026429 | A1 | * | 10/2001 | Fukuda et al. ............... 361/93.9 |
| 2006/0114633 | A1 | | 6/2006 | Watanabe |
| 2012/0099234 | A1 | * | 4/2012 | Inoue et al. ...................... 361/87 |

(Continued)

FOREIGN PATENT DOCUMENTS

| CN | 1898857 A | 1/2007 |
| CN | 101320939 A | 12/2008 |
| JP | 1-193909 | 8/1989 |

(Continued)

OTHER PUBLICATIONS

Office Action issued May 7, 2012 in German Patent Application No. 10 2011 087 598.0 (with English translation).

(Continued)

*Primary Examiner* — Thienvu Tran
*Assistant Examiner* — Angela Brooks
(74) *Attorney, Agent, or Firm* — Oblon, McClelland, Maier & Neustadt, L.L.P.

(57) ABSTRACT

A power module includes a current sensing circuit in which a transistor includes an emitter connected to a sense emitter of a current sense element of an IGBT and a base connected to ground, a current sensing resistor including one end thereof connected to a collector of the transistor and the other end thereof connected to a common connection portion. The power module detects, as a current sensing voltage, a potential difference generated by the current sensing resistor based on the common connection portion as a reference, compares the current sensing voltage with a predetermined threshold voltage, and determines whether or not an overcurrent flows through the IGBT according to a magnitude relation therebetween.

15 Claims, 13 Drawing Sheets

(56) References Cited

U.S. PATENT DOCUMENTS

| | | | | |
|---|---|---|---|---|
| 2012/0224288 A1* | 9/2012 | Uota et al. | ...................... | 361/79 |
| 2013/0214748 A1* | 8/2013 | Uota et al. | ................... | 323/234 |

FOREIGN PATENT DOCUMENTS

| JP | 5-276761 | | 10/1993 |
|---|---|---|---|
| JP | 9-145749 | A | 6/1997 |
| JP | 10-322185 | | 12/1998 |
| JP | 11-262242 | A | 9/1999 |
| JP | 11-299218 | | 10/1999 |
| JP | 2005-341663 | | 12/2005 |
| JP | 2006-157675 | A | 6/2006 |
| JP | 2007-195006 | | 8/2007 |
| JP | 2007-195007 | | 8/2007 |
| JP | 2010-171696 | A | 8/2010 |
| JP | 2011-4243 | A | 1/2011 |

OTHER PUBLICATIONS

Office Action issued Mar. 4, 2014 in Japanese Patent Application No. 2011-047250 with partial English language translation.

Combined Chinese Office Action and Search Report issued Dec. 4, 2013 in Patent Application No. 201110397860.X with Partial English Translation.

Office Action issued Aug. 5, 2014 to Chinese Patent Application No. 201110397860.X, with partial English translation.

Office Action issued Dec. 16, 2014 in Japanese Patent Application No. 2014-088830 (with partial English translation).

* cited by examiner

F I G . 1
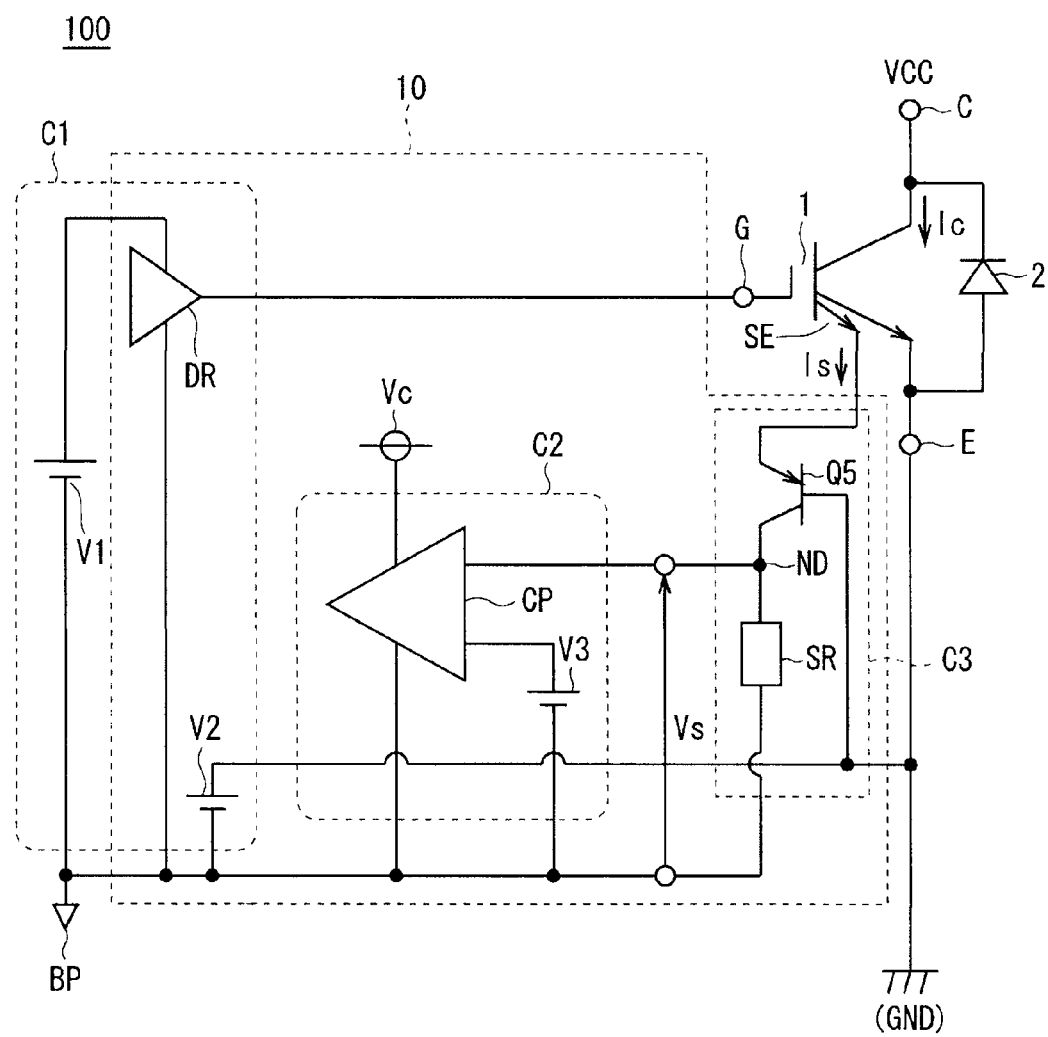

F I G. 4
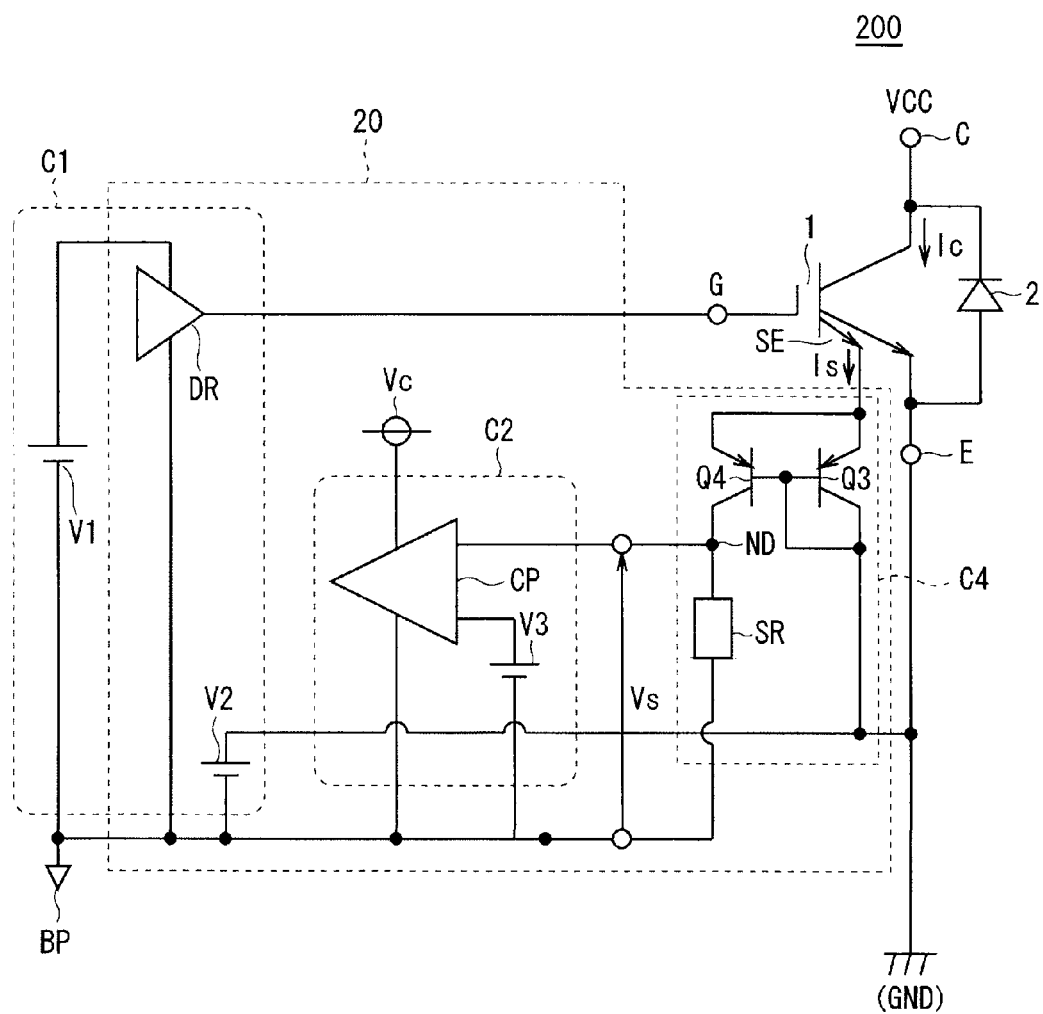

F I G . 7
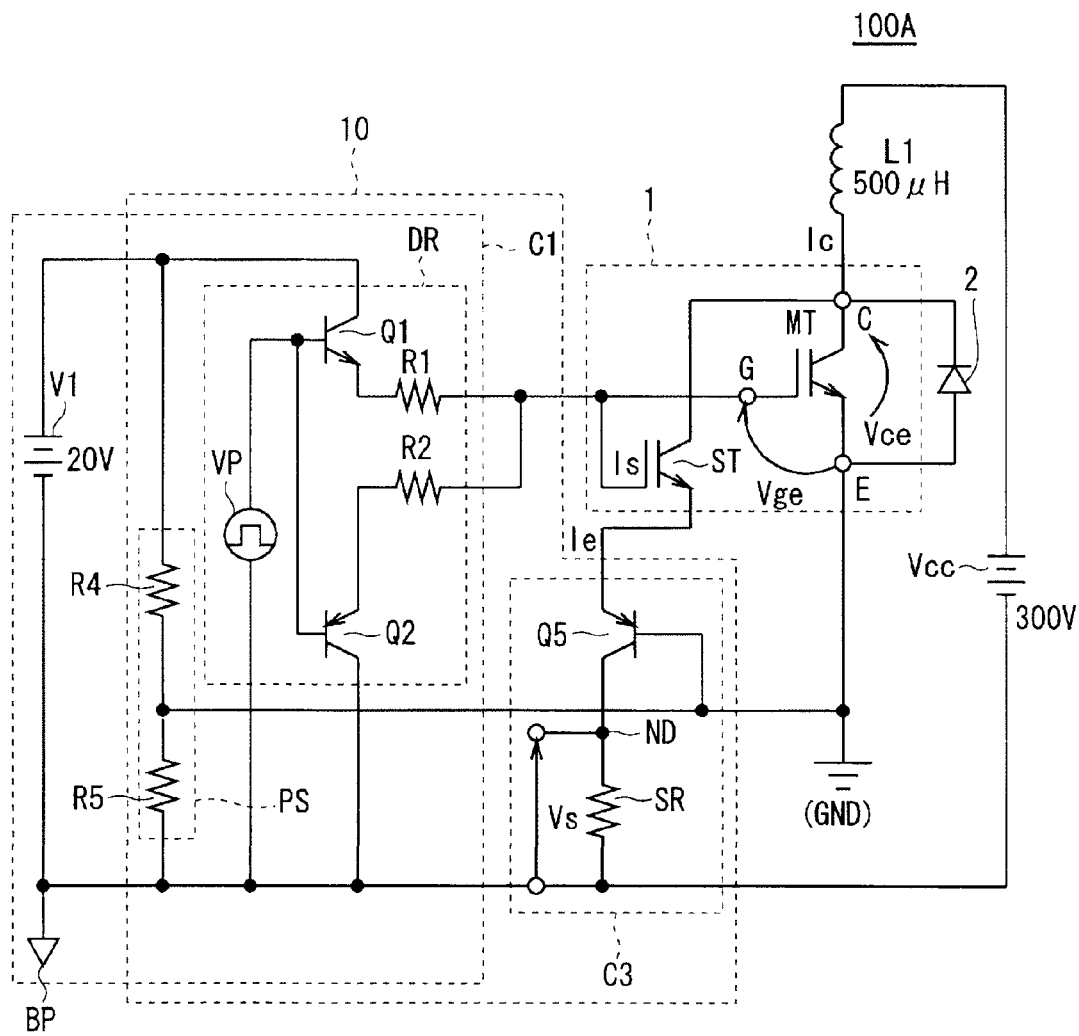

POWER MODULE

BACKGROUND OF THE INVENTION

1. Field of the Invention

The present invention relates to a power module used for controlling a motor of an industrial or consumer apparatus.

2. Description of the Background Art

A power switching semiconductor device such as an IGBT (Insulated Gate Bipolar Transistor) or a power MOSFET (Metal-Oxide Semiconductor Field-Effect Transistor) adopts the following method to detect an overcurrent. The power switching semiconductor device is configured of a main element through which a main current flows and a current sense element through which a part of the main current flows; a sense current outputted from an output terminal (sense emitter) of the current sense element is converted, by a resistor (current sensing resistor), into a voltage to serve as a detection voltage; and the detection voltage is compared with a predetermined reference voltage to determine whether the detection voltage is normal or abnormal (overcurrent level).

Here, the current sense element is structured of a collector (drain) which is shared by the main element, and an emitter (source) having an area which is arranged to have a predetermined area ratio to an area of an emitter (source) of the main element so that a sense current at a predetermined division ratio to the main current flows therethrough.

For example, in the case where an emitter area ratio of the current sense element with respect to the main element is $\frac{1}{10000}$, a current which is $\frac{1}{10000}$ of the current of the main element flows through the current sense element. This makes it possible to detect a current by a resistor having a relatively smaller resistance.

Here, when the current sensing resistor is connected to the current sense element, a difference between voltages of gates of the main element and the current sense element is caused, which results in a change of a current division ratio. Since this division ratio changes largely when a resistance of the current sensing resistor is large, it is necessary to use a smaller resistance for sensing.

However, when a smaller resistance is used for sensing, a threshold voltage (reference voltage) for determining an overcurrent becomes smaller. This causes a factor for a malfunction (false detection).

Japanese Patent Application Laid-Open No. 10-322185 (1998) discloses, in FIG. 1, a configuration in which a sense current is not directly sensed by a resistor, but is received by a current mirror circuit configured of an N-channel MOS transistor, and a mirror current (current I4) obtained by the current mirror circuit is converted into a voltage by a current sensing resistor (resistor R1) connected to a power source (voltage V3) of the current mirror circuit to thereby form a detection voltage (voltage V1).

According to this configuration, the detection voltage V1 is expressed as V1=V3−(I4×R1). Since the detection voltage V1 depends on the voltage V3 of the power source, the detection voltage V1 varies according to a change of the voltage V3, and this may lead to a drop in accuracy of current sensing.

A similar problem is also caused in a technique disclosed in Japanese Patent Application Laid-Open No. 1-193909 (1989) (FIGS. 1 and 2) in which a current mirror circuit for receiving a sense current and generating a mirror current is combined with a current mirror circuit for generating a reference current as a mirror current, and the presence or absence of an overcurrent is determined according to a magnitude relation between the mirror current of the sense current and the reference current. Also, in this case, when a source voltage of the current mirror circuit changes, the mirror current changes, and a drop in accuracy of current sensing may be caused.

As described above, according to a conventional configuration of a power switching semiconductor device for sensing an overcurrent, in the case where a sense current is sensed by a resistor, a variation thereof becomes large when a current sensing resistance is large, and a false detection tends to be caused when the current sensing resistance is small. Also, in the case where the sense current is sensed by using a current mirror circuit, a drop in accuracy of current sensing may be caused with fluctuations in power source.

SUMMARY OF THE INVENTION

It is an object of the present invention to provide a power module that does not cause a false detection and a drop in accuracy of current sensing even in the case where a sense current is sensed by a resistor or a current mirror circuit.

An electronic device according to an aspect of the present invention includes a power switching semiconductor device provided with a main element through which a main current flows, and a current sense element which is configured to allow a part of the main current to flow therethrough and includes an output terminal from which a sense current is outputted, a current sensing circuit provided with a first transistor including a first main electrode connected to the output terminal of the current sense element, and a current sensing resistor including one end thereof connected to a second main electrode of the first transistor and other end thereof connected to a common connection portion, the first transistor including a control electrode connected to a first reference potential, an overcurrent determination circuit that detects, as a current sensing voltage, a potential difference generated by the current sensing resistor based on the common connection portion as a reference, compares the potential difference with a predetermined threshold voltage, and determines whether or not an overcurrent flows through the power switching semiconductor device according to a magnitude relation between the potential difference and the predetermined threshold voltage, and a drive circuit that generates a control signal applied to a control electrode of the power switching semiconductor device.

According to an aspect of the power module, when the on-voltage of the power switching semiconductor device is low, and the current sensing resistor is connected to the current sense element, a difference is caused between the voltages applied to the control electrodes of the main element and the current sense element, and a current division ratio changes. As a result, an accurate sense current cannot be obtained. However, since the first transistor is connected to the output terminal of the current sense element, the voltage change at the output terminal of the current sense element is minimized to a voltage drop caused by the on-resistance of the first transistor, which is, for example, about 0.7 V. As a result of this, a voltage difference between voltages applied to the control electrodes of the main element and the current sense element is reduced to about 0.7 V and becomes stable, so that the accuracy in detecting the sense current improves. Since the voltage difference between the voltages applied to the control electrodes of the main element and the current sense element is reduced to about 0.7 V, there is no need to consider that the current division ratio varies between the main element and the current sense element, and the resistance of the current sensing resistor can be arbitrarily set. Therefore, the false detection can be prevented by increasing the resistance of the current sensing resistor.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram illustrating a configuration of a power module according to a first preferred embodiment of the present invention;

FIG. 4 is a circuit diagram illustrating a configuration of a power module according to a second preferred embodiment of the present invention;

FIG. 7 is a diagram illustrating a configuration of a first variation of the first preferred embodiment of the present invention;

DESCRIPTION OF THE PREFERRED EMBODIMENTS

Figure 2:
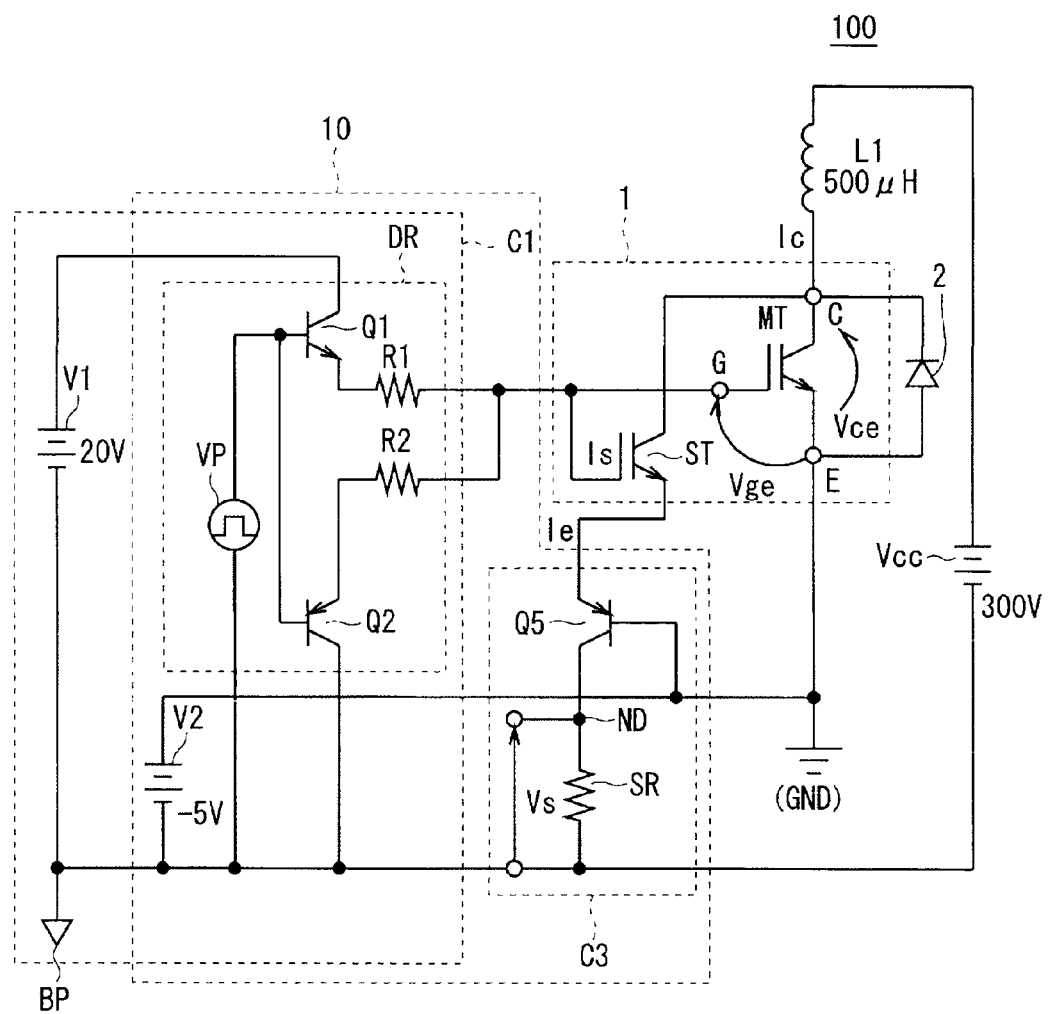
FIG. 2 is a circuit diagram illustrating a simulation condition set therein according to the first preferred embodiment of the present invention.

Hereinafter, although a description will be given of an IGBT as an example of a power switching semiconductor device, the present invention can be applied to other types of power switching semiconductor devices such as those configured of a MOSFET or a bipolar transistor. Although the conductivity type of the power switching semiconductor device will be described as an N-channel type, it is needless to say that a P-channel type can also serve the purpose.

First Embodiment

[Device Configuration]

FIG. 1 is a circuit diagram illustrating a configuration of a power module 100 according to the first preferred embodiment of the present invention. As illustrated in FIG. 1, the power module 100 is provided with a drive control circuit 10 that drives an IGBT 1 to turn into an on state or an off state by controlling a voltage (gate voltage) supplied between a gate and an emitter of the IGBT 1.

The drive control circuit 10 includes a drive circuit C1 with a DC power source V1 as a drive power source, an overcurrent determination circuit C2, and a current sensing circuit C3.

A free wheel diode 2 is connected in reverse direction in parallel between a collector C and an emitter E of the IGBT 1. A return current from a main circuit flows through the free wheel diode 2 when the IGBT 1 is in the off state.

In the power module 100 illustrated in FIG. 1, a main power source potential VCC is applied to the collector C of the IGBT 1, and a ground potential GND (first reference potential) is applied to the emitter E because the emitter E is grounded. Then, an output of a driver DR of the drive circuit C1 is fed to the gate G of the IGBT 1.

The driver DR receives the DC power source V1 as a drive power source, and a cathode of the DC power source V1 is connected to a common connection portion BP of the drive control circuit 10 so as to provide a reference potential of the drive control circuit 10. Two input portions of the driver DR are connected to an anode of the DC power source V1 and the common connection portion BP, respectively.

The IGBT 1, for detection of an overcurrent, includes a main element through which a main current flows and a current sense element configured to allow a part of the main current to flow therethrough, and is configured so that a sense current is outputted from an output terminal (sense emitter) of the current sense element.

While the current sense element has the collector (drain) thereof shared with the main element, an area of the emitter (source) thereof is arranged to have a predetermined area ratio to an area of the emitter (source) of the main element so that a sense current at a predetermined division ratio to the main current flows therethrough.

The current sensing circuit C3 includes a PNP transistor Q5 having an emitter thereof connected to an sense emitter SE of the IGBT 1 and a base thereof that is grounded, and a current sensing resistor SR having one end thereof connected to a collector of the PNP transistor Q5 and other end thereof connected to the common connection portion BP. Here, a potential difference between a potential generated by the current sensing resistor SR and a potential of the common connection portion BP serving as a reference is assumed as a current sensing voltage Vs.

The overcurrent determination circuit C2 includes a comparator CP receiving the potential of the common connection portion BP as a reference potential and operating with the power source potential Vc. One input of the comparator CP is connected to a connection node between the collector of the PNP transistor Q5 and the one end of the current sensing resistor SR, the other input of the comparator CP is connected to an anode of a DC power source V3 for supplying an arbitrary threshold voltage, and a cathode of the DC power source V3 is connected to the common connection portion BP.

The comparator CP compares the current sensing voltage Vs with the threshold voltage, determines, according to the magnitude relation there between, whether an overcurrent is flowing or not, and feeds a result thereof to the drive circuit C1 for use in controlling the driver DR. When the current sensing voltage Vs indicates an overcurrent level, the drive circuit C1 performs control such as turning off the IGBT 1. However, since this is remotely related to the present invention, any further description will not be given.

An anode of a DC power source V2 included in the drive circuit C1 is grounded, and a cathode thereof is connected to the common connection portion BP. Here, the anode of the DC power source V2 is grounded together with the emitter E of the IGBT 1. It is also possible to use a P-channel MOSFET transistor instead of the PNP transistor Q5. In that case, transistors other than the IGBT 1 can also be configured of MOSFETs.

[Device Operation]

Next, current sensing operation of the power module 100 will be described. In the power module 100, the drive control circuit 10 includes its own common connection portion BP that receives a negative bias applied from the DC power source V2 and serves as a drive circuit reference potential (second reference potential). Then, since the DC power source V1 drives the driver DR while making the drive circuit reference potential as a reference, the gate of the IGBT 1 is configured to receive, as a control signal, a positive bias and a negative bias. Here, since the DC power source V2 sets a negative potential, it will be sometimes referred to as "potential setting means".

Figure 3:
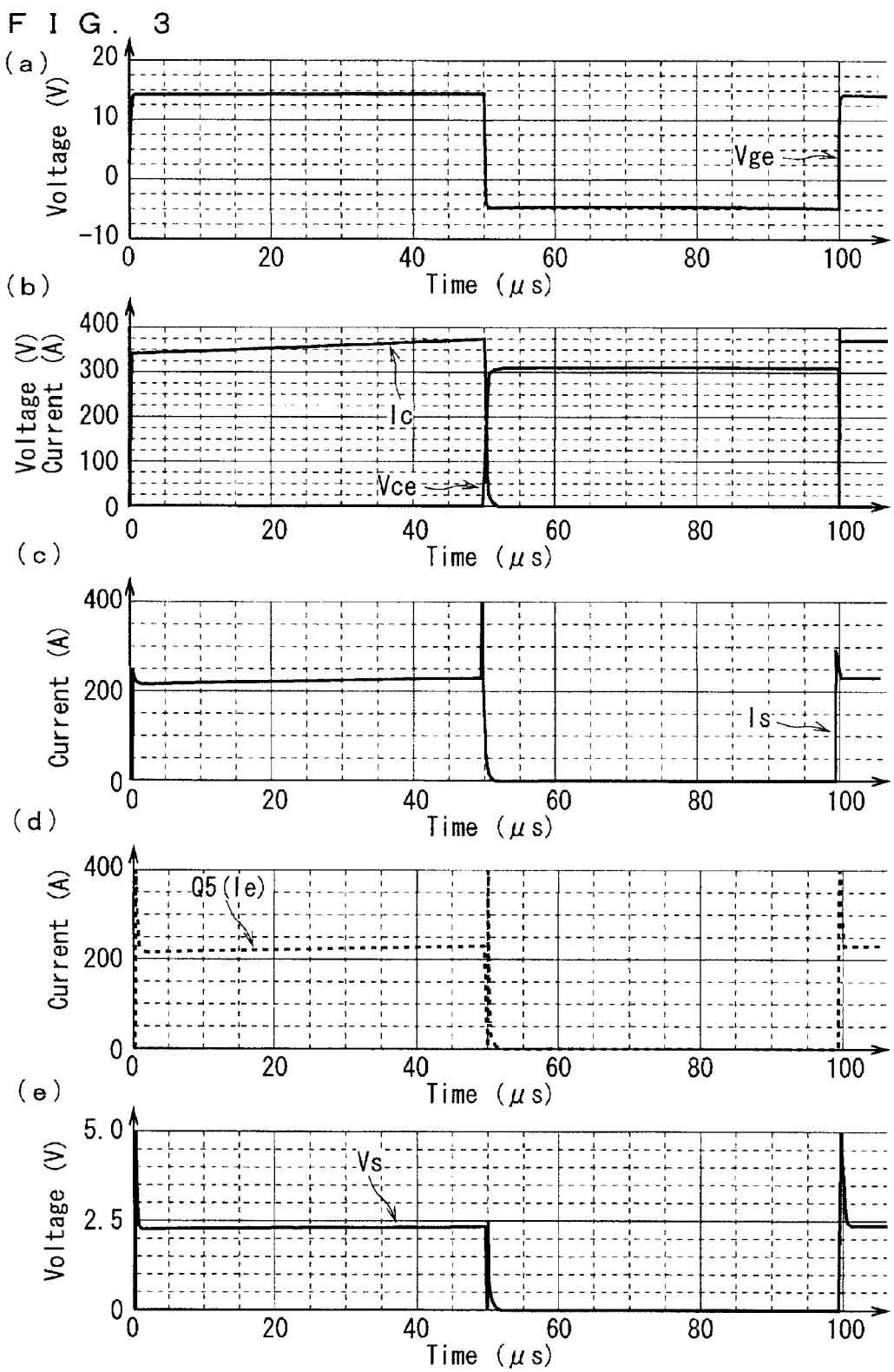
FIG. 3 is a chart illustrating results of the simulation according to the first preferred embodiment of the present invention.

A result of the simulation of the current sensing operation of the power module 100 when the positive and negative biases are applied to the gate of the IGBT 1 in this way is illustrated in FIG. 3. Here, FIG. 2 is a circuit diagram illustrating a simulation condition set therein while elements of the current sensing circuit C3 and the drive circuit C1 for performing the simulation are specified. It should be noted that portions identical with those in FIG. 1 are identified with identical reference numerals or symbols, and descriptions thereof will not be repeated.

Referring to FIG. 2, the IGBT 1 is divided into a main element MT and a current sense element ST, a gate-emitter voltage (gate voltage) of the main element MT is expressed as Vge, and a collector-emitter voltage is expressed as Vice. Further, a current flowing through the IGBT 1 in its entirety is expressed as a main current Ic, and a current flowing through the current sense element ST is expressed as a sense current Is. At the same time, a current flowing through the PNP transistor Q5 is expressed as a current Ie.

In the drive circuit C1, the driver DR includes an NPN transistor Q1 having a collector thereof connected to the anode of the DC power source V1 and an emitter thereof connected to the gate of the current sense element ST through a resistor R1; a PNP transistor Q2 having a collector thereof connected to the common connection portion BP and an emitter thereof connected to the gate of the current sense element ST; and a pulse signal source VP that applies a pulse signal having a height of 0 to 20 V to the bases of the NPN transistor Q1 and the PNP transistor Q2. The pulse signal source VP is connected to the common connection portion BP and receives the drive circuit reference potential as a reference. Here, the resistor R1 is a resistor for setting a switching speed of the IGBT 1 when the IGBT 1 is on, and the resistor R2 is a resistor for setting a switching speed of the IGBT 1 when the IGBT 1 is off.

The DC power source V1 is a power source to generate 20 V as a potential B, and the DC power source V2 is a power source to generate −5 V as a potential A. Here, the main power source potential VCC is set at 200 V.

An inductance L1 of a load between the collector of the IGBT 1 and the anode of the main power source PW is set at 500 μH, and a resistance of the current sensing resistor SR is set at 12 ohms.

Among the results of the simulation performed under the simulation condition depicted in FIG. 2, a waveform of the gate voltage Vge is illustrated in (a) portion of FIG. 3, waveforms of the collector-emitter voltage Vice and the main current Ic are illustrated in (b) portion of FIG. 3, a waveform of the sense current Is is illustrated in (c) portion of FIG. 3, a waveform of the current flowing through the PNP transistor Q5 is illustrated in (d) portion of FIG. 3, and a waveform of the current sensing voltage Vs is illustrated in (e) portion of FIG. 3.

In accordance with rising and falling of the gate voltage Vge which is a pulse signal illustrated in (a) portion of FIG. 3, the IGBT 1 turns off and on. When the IGBT 1 turns on, the main current Ic flows through as illustrated in (b) portion of FIG. 3, and, at the same time, the sense current Is flows through as illustrated in (c) portion of FIG. 3. In a same manner as in the case of the sense current Is, the current Ie flows through the PNP transistor Q5 as illustrated in (d) portion of FIG. 3, and, accordingly, the current sensing voltage Vs can be obtained as illustrated in (e) portion of FIG. 3.

Here, as illustrated in (a) portion of FIG. 3, the gate voltage Vge is formed of not only a positive bias ranging from 0 V to 15 V but also a negative bias ranging from 0V to −5 V. In this way, it is possible to securely perform the off operation of the IGBT 1 by using a pulse signal formed of the positive and negative biases as a gate voltage.

In other words, it is possible to turn off the IGBT if the gate-emitter voltage becomes equal to or lower than a threshold value of the IGBT even with application of a pulse formed only of a positive bias. However, with application of a pulse signal formed by including a negative bias, the IGBT can be more securely turned off.

In addition, in the case where a pulse signal formed of the positive and negative biases is used as the gate voltage, as compared with the case where the pulse signal is formed only of the positive bias, there is an advantage in that, even when an on-voltage of the power switching device such as the IGBT is low, a chance of false operation is minimized.

Further, when the on-voltage of the power switching device is low, and the current sensing resistor is connected to the current sense element, a potential difference (ΔVge) for an amount of voltage drop in the current sensing resistance is caused in a voltage applied to the gates of the main element and the current sense element. Since the voltage drop in the current sensing resistor becomes larger as a current flowing therethrough increases, the voltage drop becomes particularly large when an overcurrent is detected, which causes the potential difference ΔVge to increase and changes the current division ratio. As a result, an accurate sense current cannot be obtained. However, since the PNP transistor Q5 is connected to the sense emitter SE of the IGBT 1, the voltage change at the sense emitter SE is minimized to a voltage drop caused by the on-resistance of the PNP transistor Q5, which is, for example, about 0.7 V. As a result of this, the potential difference ΔVge is restricted down to about 0.7 V and becomes stable, so that the accuracy in detecting the sense current improves.

Since the potential difference ΔVge can be lowered to about 0.7 V regardless of the resistance of the current sensing resistor SR, there is no need to consider that the current division ratio varies between the main element MT and the current sense element ST, and the resistance of the current sensing resistor can be arbitrarily set. Therefore, the false detection can be prevented by increasing the resistance of the current sensing resistor SR.

Further, the overcurrent determination circuit C2 determines the state of the overcurrent by comparing the current sensing voltage Vs with an arbitrary threshold voltage by the comparator CP. However, since the threshold voltage is generated based on the drive circuit reference potential, as a reference, which is also the potential of the common connection portion BP which provides the lowest potential (negative potential), the drive circuit reference potential does not change even if the DC power source V1 changes, which makes accurate detection of current possible. Here, when the voltage of the DC power source V2 changes, the drive circuit reference potential also changes. However, when the drive circuit reference potential changes, not only the potential of the DC power source V3 but also the reference potentials of all the other circuits change in a similar way. This results in a zero relative change, and highly accurate current sensing can be maintained.

Second Preferred Embodiment

[Device Configuration]

FIG. 4 is a circuit diagram illustrating a configuration of a power module 200 according to a second preferred embodiment of the present invention. As illustrated in FIG. 4, the power module 200 is provided with a drive control circuit 20 that drives an IGBT 1 to turn into an on state or an off state by controlling a voltage (gate voltage) supplied between a gate and an emitter of the IGBT 1. Here, portions identical with those of the power module 100 illustrated in FIG. 1 are identified with identical reference numerals or symbols, and descriptions thereof will not be repeated.

The drive control circuit 20 includes a drive circuit C1 with a DC power source V1 as a drive power source, an overcurrent determination circuit C2, and a current sensing circuit C4. A difference from the drive control circuit 10 illustrated in FIG. 1 is found in the current sensing circuit C4.

The current sensing circuit C4 includes PNP transistors Q3 and Q4 having emitters thereof connected to a sense emitter SE of the IGBT 1, and a current sensing resistor SR having one end thereof connected to a collector of the PNP transistor Q4 and the other end thereof connected to a common connection portion BP. Bases of the PNP transistors Q3 and Q4 are connected together to a collector of the PNP transistor Q3, and the PNP transistors Q3 and Q4 constitute a current mirror circuit.

The collector of the PNP transistor Q3 is grounded, a cathode of a DC power source V2 is connected to the common connection portion BP, and an anode of the DC power source V2 is grounded together with an emitter E of the IGBT 1.

A connection node ND between the collector of the PNP transistor Q4 and one end of the current sensing resistor SR is connected to one input of the comparator CP.

[Device Operation]

Next, current sensing operation of the power module 200 will be described. In the power module 200, the drive control circuit 20 includes its own common connection portion BP that receives a negative bias applied from the DC power source V2 and serves as a drive circuit reference potential. Then, since the DC power source V1 drives a driver DR while making the drive circuit reference potential as a reference, the gate of the IGBT 1 is configured to receive, as a control signal, a positive bias and a negative bias.

Figure 6:
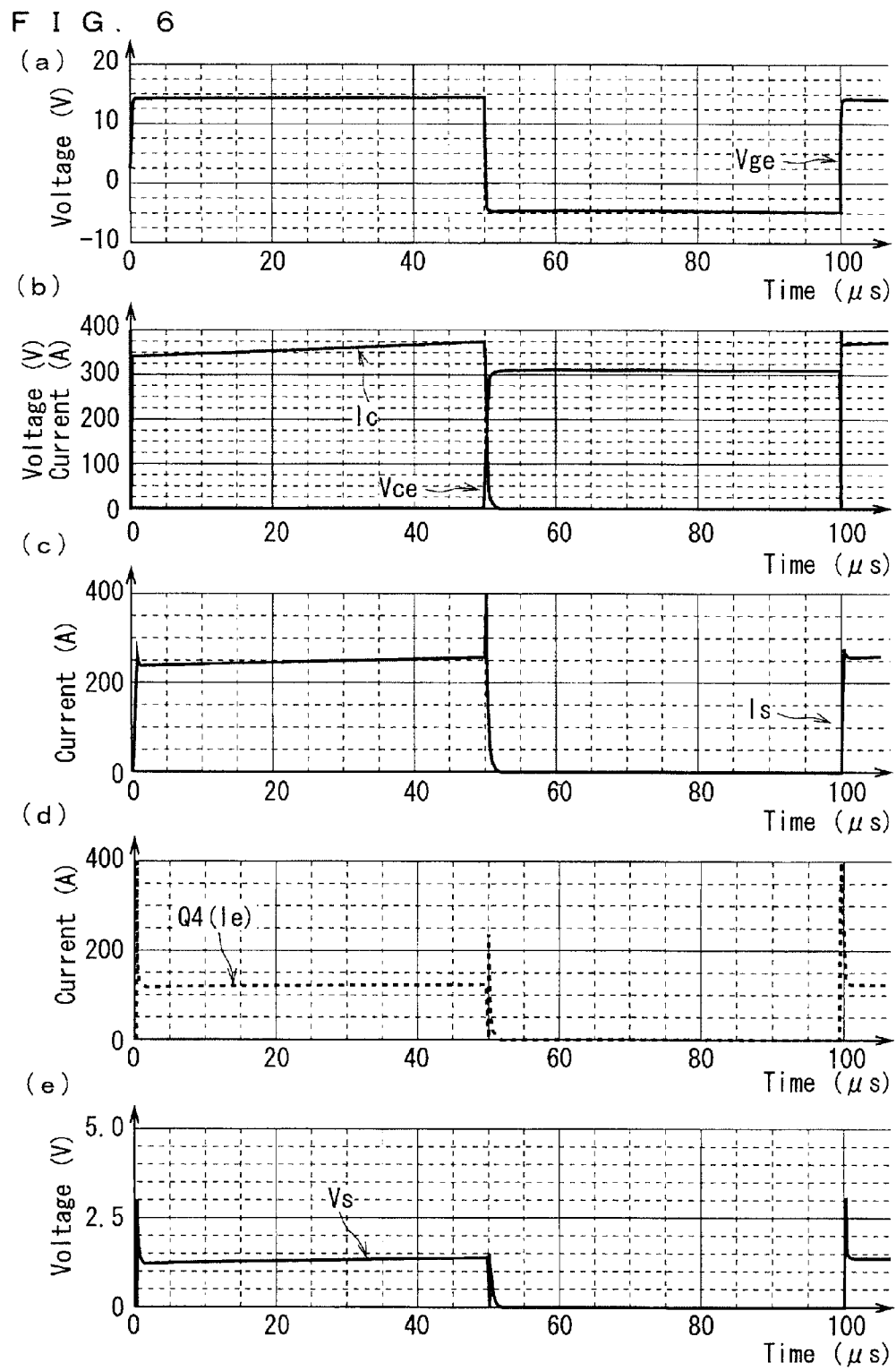
FIG. 6 is a chart illustrating results of the simulation according to the second preferred embodiment of the present invention.

A result of the simulation of the current sensing operation of the power module 200 when the positive and negative biases are applied to the gate of the IGBT 1 in this way is illustrated in FIG. 6.

Figure 5:
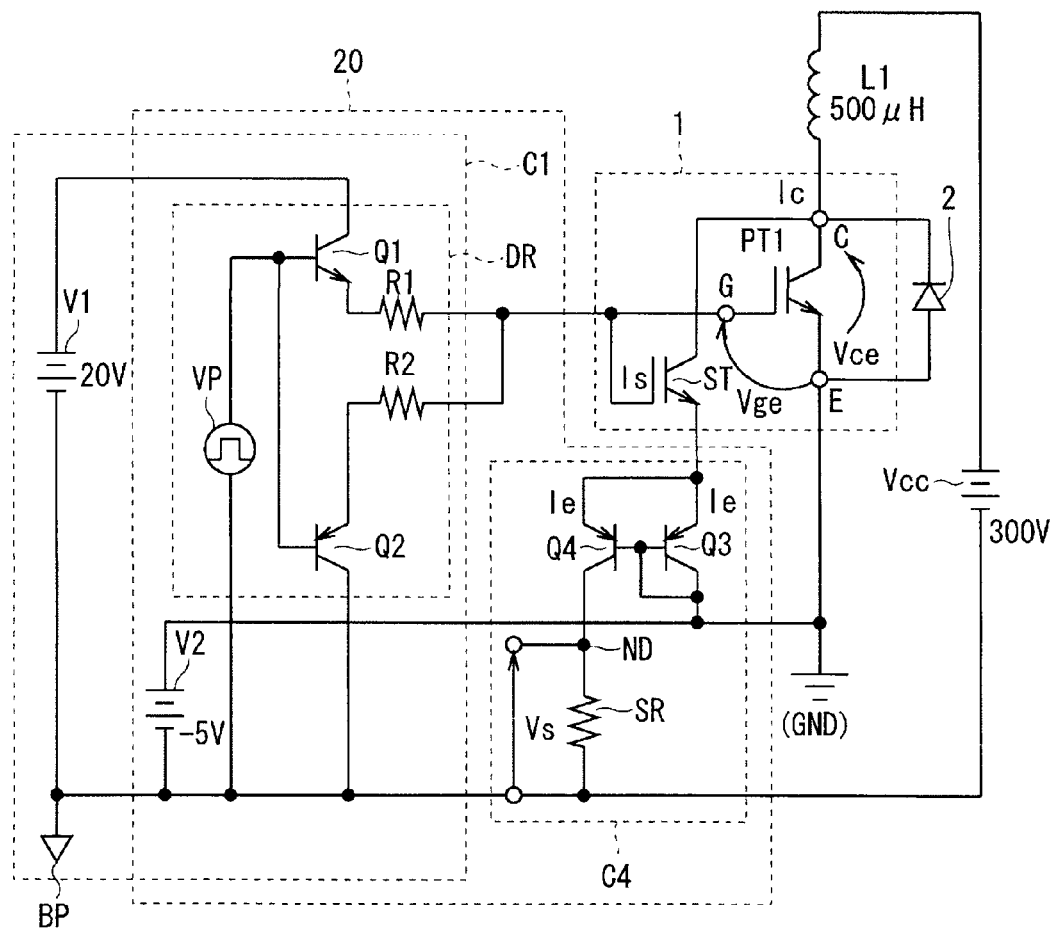
FIG. 5 is a circuit diagram illustrating a simulation condition set therein according to the second preferred embodiment of the present invention.

Here, FIG. 5 is a circuit diagram illustrating a simulation condition set therein while elements of the current sensing circuit C4 and the drive circuit C1 for performing the simulation are specified. It should be noted that portions identical with those in FIG. 1 are identified with identical reference numerals or symbols, and are assumed to have the same simulation condition. Therefore, descriptions thereof will not be repeated.

Referring to FIG. 5, a current flowing through the IGBT 1 in its entirety is expressed as a main current Ic, a current flowing through the current sense element ST is expressed as a sense current Is, and currents flowing through the PNP transistors Q3 and Q4 are individually expressed as currents Ie. Here, the transistor characteristics of the PNP transistors Q3 and Q4 are identical with each other, and the current Ie is a half of the sense current Is.

Among the results of the simulation performed under the simulation condition depicted in FIG. 5, a waveform of the gate voltage Vge is illustrated in (a) portion of FIG. 6, waveforms of the collector-emitter voltage Vice and the main current Ic are illustrated in (b) portion of FIG. 6, a waveform of the sense current Is is illustrated in (c) portion of FIG. 6, a waveform of the current flowing through the PNP transistor Q4 is illustrated in (d) portion of FIG. 6, and a waveform of the current sensing voltage Vs is illustrated in (e) portion of FIG. 6.

In accordance with rising and falling of the gate voltage Vge which is a pulse signal illustrated in (a) portion of FIG. 6, the IGBT 1 turns off and on. When the IGBT 1 turns on, the main current Ic flows through as illustrated in (b) portion of FIG. 6, and, at the same time, the sense current Is flows through as illustrated in (c) portion of FIG. 6. Then, as illustrated in (d) portion of FIG. 6, the current Ie which is about a half of the sense current Is flows through the PNP transistor Q4, and, accordingly, the current sensing voltage Vs can be obtained as illustrated in (e) portion of FIG. 6.

In this way, since the drive control circuit 20 is configured to receive the output from the sense emitter SE of the IGBT 1 by the current mirror circuit, and allows to flow the current Ie which is about a half of the sense current Is through the current sensing resistor SR, a power consumption by the current sensing resistor SR can be reduced.

For example, assuming that it is an overcurrent if the current sensing voltage Vs is 0.5 V when the main current Ic is 100 A, and the division ratio of the current sense element to the main element is $1/10000$, in the drive control circuit 10 of the first preferred embodiment, the power consumption by the current sensing resistor SR is expressed as Vs×Is=0.5×(100/10000)=5 mW. In addition, in the drive control circuit 20, the power consumption by the current sensing resistor SR is expressed as Vs×(½)Is=0.5×($5/10000$)=2.5 mW.

In this way, it is possible to arbitrarily change the current flowing through the current sensing resistor SR by providing a configuration in which the output of the sense emitter of the IGBT 1 is received by the current mirror circuit, and by changing a size (size ratio) of the transistor of the current mirror circuit or providing a plurality of transistors that generate the mirror current.

For example, if it is assumed that the size ratio of the PNP transistor Q4 to the PNP transistor Q3 is 10 to 1, the current Ie which is about $1/10$ of the sense current Is flows through the PNP transistor Q4.

[Variation 1]

In the first and second preferred embodiments described above, the drive circuit reference potential is generated by applying a negative bias to the common connection portion BP from the DC power source V2. However, instead of using the DC power source V2, the negative bias may be obtained by dividing the potential B of the DC power source V1 by resistors, or the negative bias may be obtained by using a Zener diode.

Figure 8:
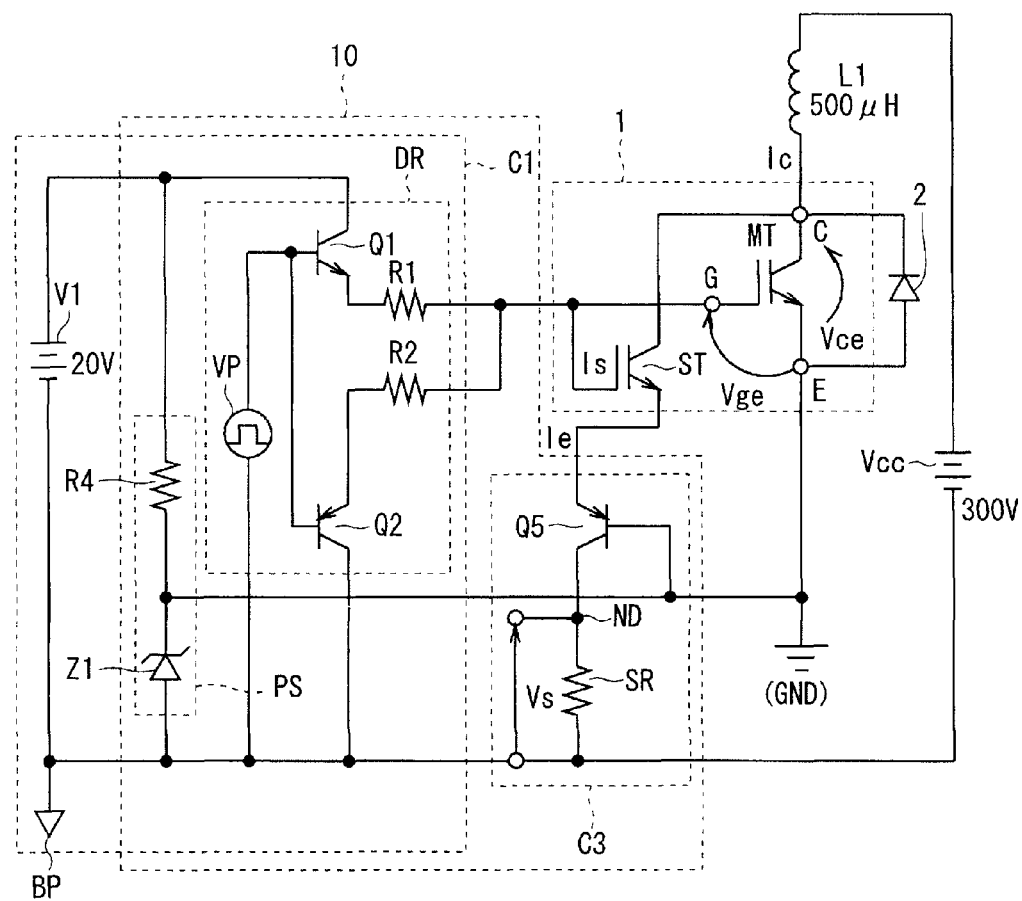
FIG. 8 is a diagram illustrating a configuration of the first variation of the first preferred embodiment of the present invention.

FIG. 7 illustrates a configuration for obtaining the negative bias by a resistor divider, and FIG. 8 illustrates a configuration for obtaining the negative bias by using a resistor and a Zener diode. It should be noted that, in FIGS. 7 and 8, portions identical with those illustrated in FIGS. 2 and 5 are identified with identical reference numerals or symbols, and descriptions thereof will not be repeated.

In a power module 100A illustrated in FIG. 7, resistors R4 and R5 are inserted, in series, between an anode of a DC power source V1 and a common connection portion BP in order of the resistors R4 and R5. A connection node between the resistors R4 and R5 is connected to a base of a PNP transistor Q5 and is grounded together with an emitter E of an IGBT 1.

This configuration has an advantage in that a negative bias determined by a resistor dividing ratio, for example, −5 V, can be applied to the common connection portion BP while the potential A serves as a reference, and the DC power source V2 is not required. Here, since the resistors R4 and R5 can set the negative potential, these will be referred to as "potential setting means PS".

In a power module 100B illustrated in FIG. 8, a resistors R4 and a Zener diode Z1 are inserted, in series, between an anode of a DC power source V1 and a common connection portion BP in order of the resistor R4 and the Zener diode Z1. An anode of the Zener diode Z1 is connected to the common connection portion BP, a cathode of the Zener diode Z1 is connected to the resistor R4, and a connection node therebetween is connected to a base of a PNP transistor Q5 and grounded together with an emitter E of an IGBT 1.

This configuration has an advantage in that a negative bias determined by a Zener voltage, for example, −5 V, can be applied to the common connection portion BP while a potential A serves as a reference, and the DC power source V2 is not required.

Since the negative bias is defined by the Zener voltage of the Zener diode Z1, the negative bias can be easily set by using a Zener diode having a desired Zener voltage. Here, since the resistor R4 and the Zener diode Z1 can set the negative potential, these will be referred to as "potential setting means PS".

FIGS. 7 and 8 illustrate variations based on the power module 100. However, the same may also applied to the power module 200.

[Variation 2]

In the power module 100 according to the first preferred embodiment, a configuration in which the anode of the DC power source V2 is connected to the base of the PNP transistor Q5 is described. In the power module 200 according to the second preferred embodiment, a configuration in which the anode of the DC power source V2 is connected to the collector of the PNP transistor Q3 is described. However, as illustrated in FIGS. 2 and 5, the gate voltage (gate-emitter voltage) of the current sense element ST becomes lower than the gate voltage (gate-emitter voltage) of the main element MT by a base-emitter voltage, i.e., 0.7 V, of the PNP transistor Q5 and the PNP transistor Q4. For this reason, it may be possible that the current division ratio of the current sense element ST to the main element MT changes, and this may lead to a drop in accuracy of current sensing.

Figure 9:
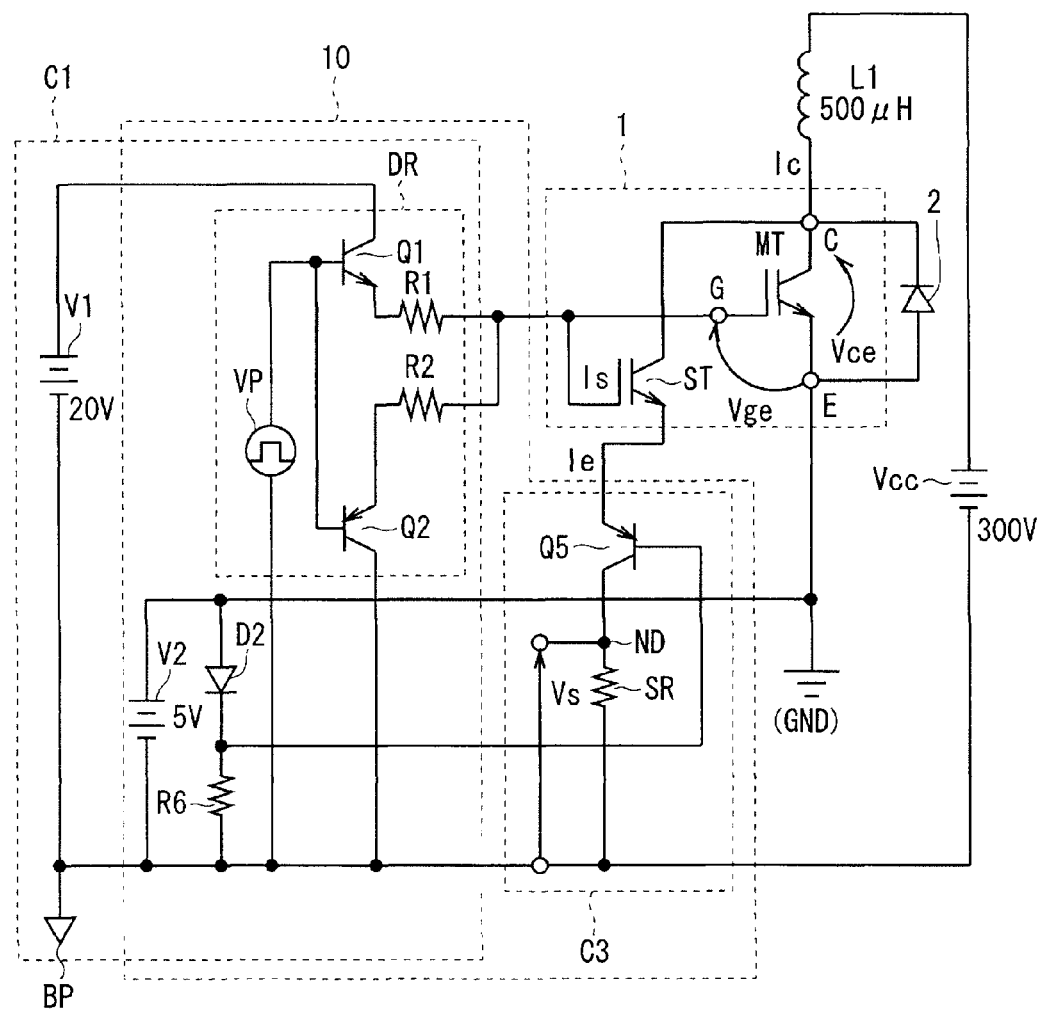
FIG. 9 is a diagram illustrating a configuration of a second variation of the first preferred embodiment of the present invention.
Figure 10:
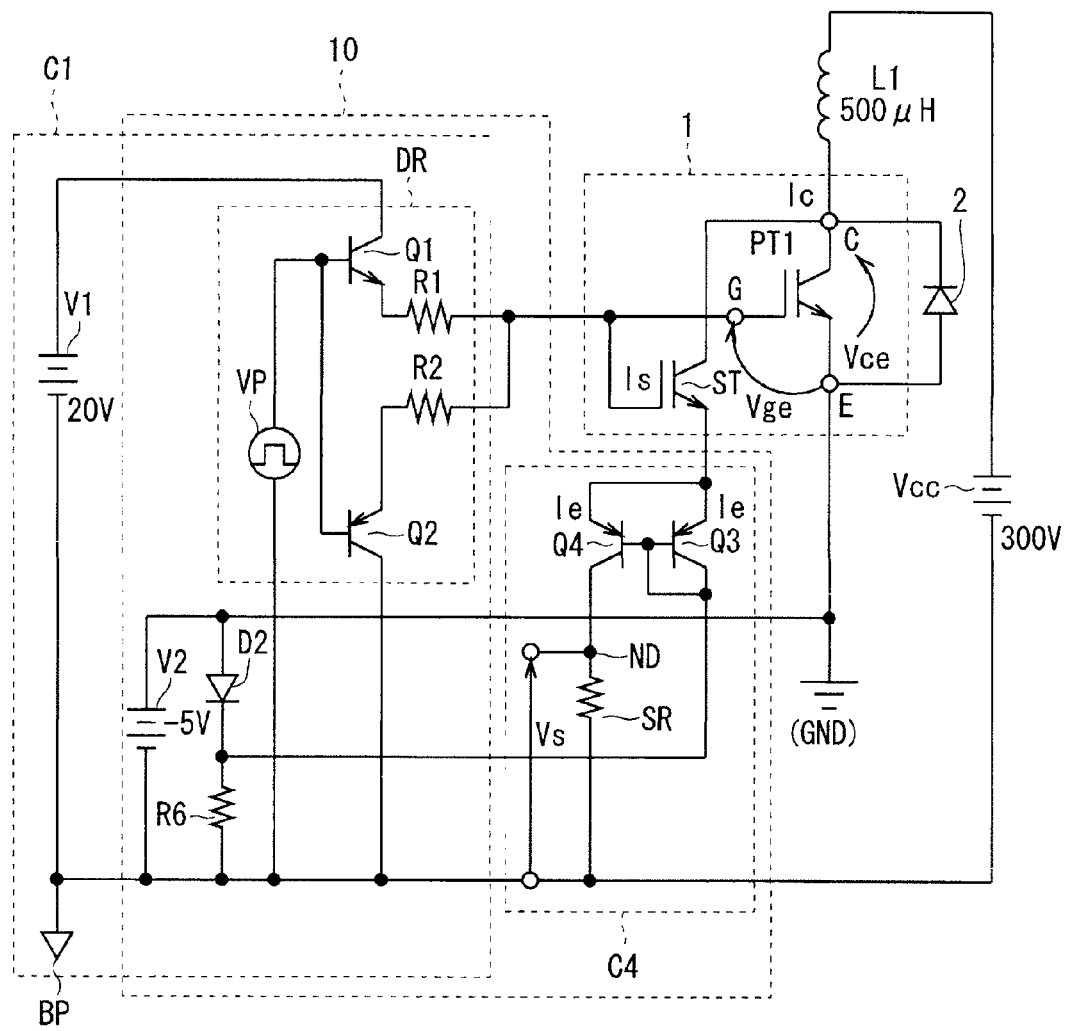
FIG. 10 is a diagram illustrating a configuration of the second variation of the first preferred embodiment of the present invention.

To avoid this, it is also possible to adopt the configurations illustrated in FIGS. 9 and 10. Specifically, FIG. 9 illustrates a configuration of a power module 100C in which a potential D resulted from reducing a predetermined potential from a potential A of the DC power source V2 is applied to a base of a PNP transistor Q5. FIG. 10 illustrates a configuration of a power module 200A in which a potential D resulted from reducing a predetermined potential from a potential A of the DC power source V2 is applied to a base of a PNP transistor Q4. It should be noted that, in FIGS. 9 and 10, portions identical with those illustrated in FIGS. 2 and 5 are identified with identical reference numerals or symbols, and descriptions thereof will not be repeated.

In the power module 100C illustrated in FIG. 9, a diode D2 and a resistor R6 are inserted, in series, between an anode of a DC power source V2 and a common connection portion BP in order of the diode D2 and the resistor R6. A connection node between the diode D2 and the resistor R6 is connected to a base of a PNP transistor Q5.

The diode D2 is connected to the DC power source V2 in the forward direction and capable of generating a potential D which is resulted from reducing a built-in voltage (p-n voltage) of the diode from the potential A, which is about 0.7 V. Applying this to the base of the PNP transistor Q5 offsets an amount of a voltage drop of the gate voltage of the current sense element ST, and makes it possible to bring the gate voltages (gate-emitter voltages) of the main element MT and the current sense element ST to coincide with each other. As a result, it is possible to prevent the current division ratio of the current sense element ST to the main element MT from changing and achieve more accurate current sensing.

In the power module 200A illustrated in FIG. 10, a diode D2 and a resistor R6 are inserted, in series, between an anode of a DC power source V2 and a common connection portion BP in order of the diode D2 and the resistor R6. A connection node between the diode D2 and the resistor R6 is connected to a base of a PNP transistor Q4.

The diode D2 is connected to the DC power source V2 in the forward direction and capable of generating a potential D which is resulted from reducing a built-in voltage (p-n voltage) of the diode from the potential A, which is about 0.7 V. Applying this to the base of the PNP transistor Q4 offsets an amount of a voltage drop of the gate voltage of the current sense element ST, and makes it possible to bring the gate voltages (gate-emitter voltages) of the main element MT and the current sense element ST to coincide with each other. As a result, it is possible to prevent the current division ratio of the current sense element ST to the main element MT from changing and achieve more accurate current sensing.

Further, FIGS. 9 and 10 illustrate the configurations in which the diode D2 and the resistor R6 are inserted, in series, between the anode of the DC power source V2 and the common connection portion BP. Alternatively, a diode-connected transistor may be used instead of the diode D2 as illustrated in FIGS. 11 and 12.

Figure 11:
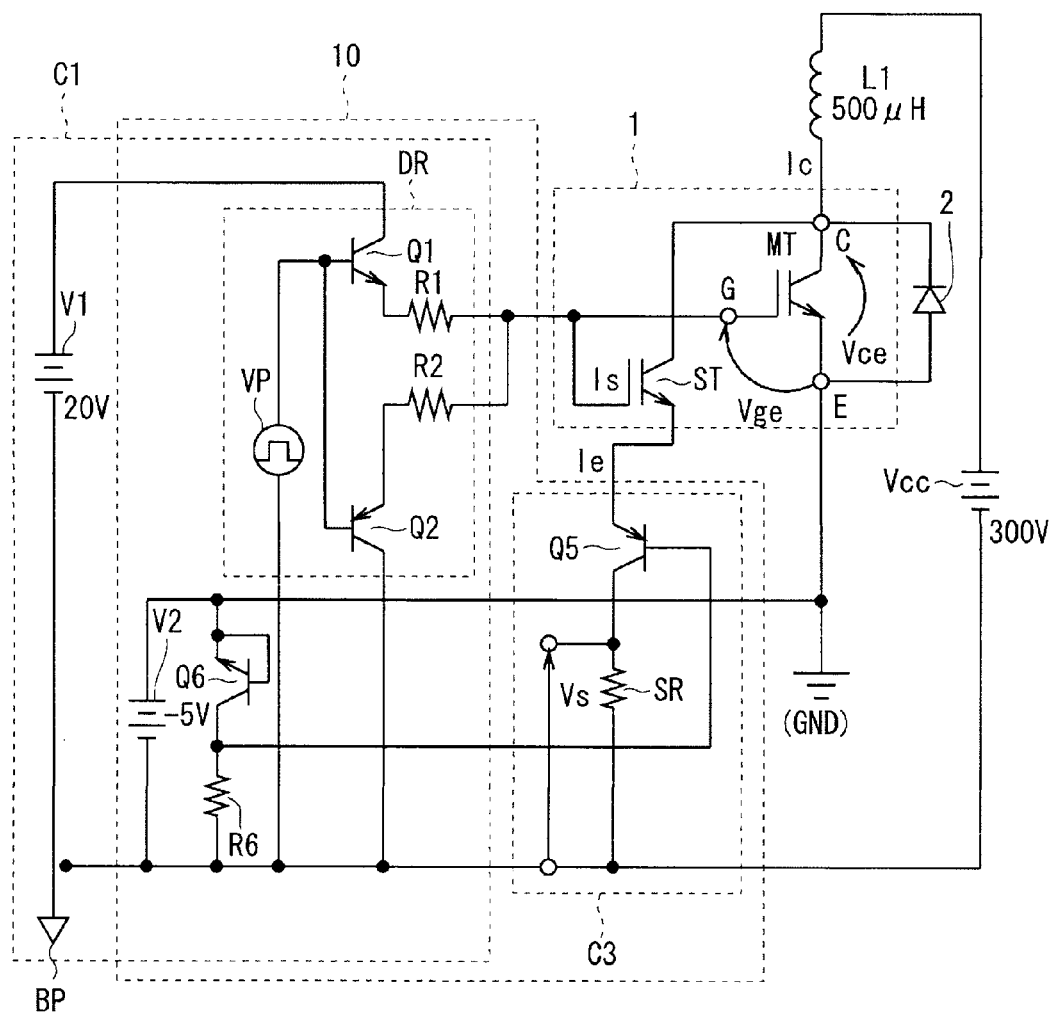
FIG. 11 is a diagram illustrating a configuration of the second variation of the first preferred embodiment of the present invention.

In a power module 100D illustrated in FIG. 11, a PNP transistor Q6 and a resistor R6 are inserted, in series, between an anode of a DC power source V2 and a common connection portion BP in order of the PNP transistor Q6 and the resistor R6. An emitter of the PNP transistor Q6 is connected to a base thereof, and the PNP transistor Q6 functions as a diode. A connection node between the PNP transistor Q6 and the resistor R6 is connected to a base of a PNP transistor Q5.

Figure 12:
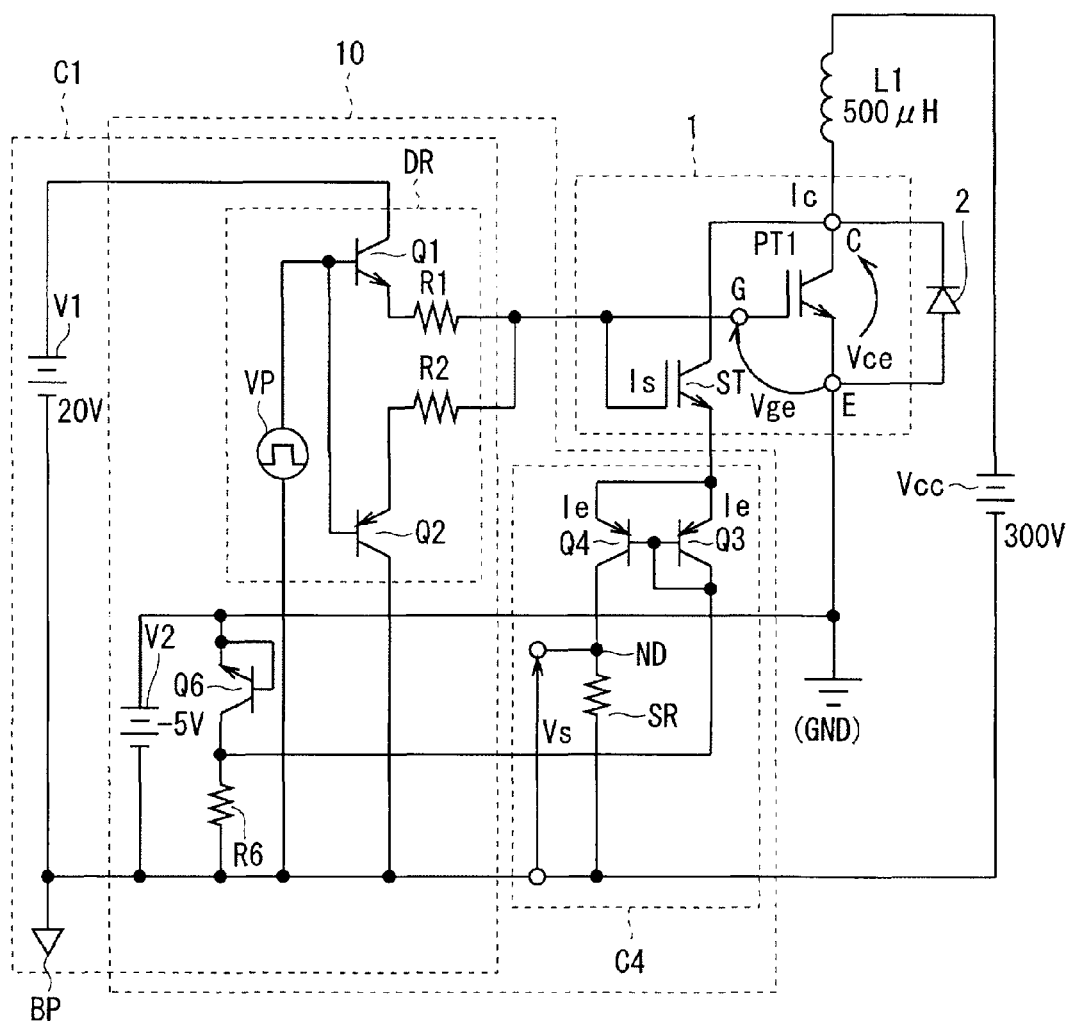
FIG. 12 is a diagram illustrating a configuration of the second variation of the first preferred embodiment of the present invention.

In a power module 200B illustrated in FIG. 12, a PNP transistor Q6 and a resistor R6 are inserted, in series, between an anode of a DC power source V2 and a common connection portion BP in order of the PNP transistor Q6 and the resistor R6. An emitter of the PNP transistor Q6 is connected to a base thereof, and the PNP transistor Q6 functions as a diode. A connection node between the PNP transistor Q6 and the resistor R6 is connected to a base of a PNP transistor Q4.

With this configuration, it is possible to generate a potential D resulted from reducing a built-in voltage from the potential A as in the case of using the diode. In addition to this, since the same transistor (if possible, the transistor in an identical production lot) as used for the PNP transistor Q5 and the PNP transistor Q4 is used for the PNP transistor Q6, individual differences caused by temperature characteristics and variations in the process are minimized among the transistors. As a result, a voltage drop in the PNP transistor Q6 can be made the same as those in the PNP transistor Q5 and the PNP transistor Q4, and further accurate current sensing is made possible.

[Making Power Module Intelligent]

In each of the power modules 100 and 200 described in the first and second preferred embodiments, the drive control circuits 10 and 20 are configured by excluding the IGBT 1, the free wheel diode 2, the power source applying the main power source potential VCC, and the DC power source V1. However, a whole or a part of the drive control circuit 10 or 20 may be built into a control IC.

A package integrating therein such a control IC, the IGBT 1, and the free wheel diode 2 will be referred to as an intelligent power module (IPM).

By integrating the drive control circuits 10 and 20 into individual ICs, it is possible to reduce the circuit size and miniaturize the power modules 100 and 200 in their entirety.

In addition, by integrating the drive circuits 10 and 20 in their entirety into IC, the power module is configured of the IGBT 1, the free wheel diode 2, and the drive control circuit 10 or 20. This arrangement reduces the number of components, and individual differences among the components, and lowers the rejection rate.

Since the number of components is reduced, mistakes in assembling are reduced, a probability in causing a fault during assembling is reduced, and the rejection rate is reduced.

Further, since the number of components is reduced, it becomes easier to manage the components and assemble the components together, which can lower the production cost.

With reduced individual differences among the components resulted from the reduced number of components, it is possible to increase the accuracy in current sensing.

As an example of integrating a part of the drive control circuits 10 and 20 into individual ICs involves a case of integrating the NPN transistor Q1 and the PNP transistor Q2 that constitute the driver DR into an IC, and a case of integrating also the resistors R1 and R2 in addition to the NPN transistor Q1 and the PNP transistor Q2 into an IC.

Integrating the NPN transistor Q1, the PNP transistor Q2, and the DC power source V1 into an IC also involves a case of integrating also the resistors R1 and R2 in addition to the NPN transistor Q1, the PNP transistor Q2, and the DC power source V1 into an IC. The DC power source V1 is incorporated as a regulator into the IC.

Further, the case also involves integrating the drive control circuits 10 and 20 excluding the current sensing resistor SR into individual ICs. Since the current sensing resistor SR requires to have its resistance value to be exactly set for performing highly accurate sensing, and the resistance cannot be changed once it is integrated into an IC, it is preferable that the current sensing resistor SR be configured separately.

The same is also applied to the resistors R1 and R2 for setting the switching speed of the IGBT 1. Therefore, there are sometimes cases in which the resistors R1 and R2 are separately configured in preparation for the case in which the switching speed is changed differently for each product.

[Use of Semiconductor Having a Wide Band Gap]

In the power modules 100 and 200 according to the first and second preferred embodiments, no descriptions have been given of materials used for the IGBT 1 and the free wheel diode 2. However, the IGBT 1 and the free wheel diode 2 may be arranged as a silicon semiconductor device formed on a silicon (Si) substrate. Alternatively, the IGBT 1 may be arranged as a silicon semiconductor device, and the free wheel diode 2 may be arranged as a silicon carbide semiconductor device formed on a silicon carbide (SiC) substrate or as a gallium nitride semiconductor device formed on a substrate that is made of a gallium nitride (GaN) based material.

SiC and GaN are wide band gap semiconductors. Since the semiconductor device formed of the wide band gap semiconductor has a high withstand voltage and allowable current density, it is possible to miniaturize the device as compared with the silicon semiconductor device. Using such a miniaturized semiconductor device makes it possible to miniaturize the power module incorporating therein such a device.

Since the wide band gap semiconductor has a high thermal resistance, it is possible to miniaturize a radiation fin of a heatsink and use air cooling instead of water cooling. Accordingly, further miniaturization of the power module is possible.

Further, since the device can be made smaller than the silicon semiconductor device, the drive control circuits 10 and 20 can be miniaturized if they have the same rating.

Contrary to this, the free wheel diode 2 may be formed as a silicon semiconductor device, and the switching device (including a bipolar transistor and a MOSFET) such as the IGBT 1 may be formed as a wide band gap semiconductor device such as a silicon carbide semiconductor device or a gallium nitride semiconductor device. In this case, the same effect as the foregoing can also be obtained.

In the case where the switching device is a silicon semiconductor device, the current division ratio tends to change by the voltage difference ($\Delta$Vge) applied between the gates of the main element and the current sense element because the on-voltage is low. However, when the wide band gap semiconductor device is used as the switching device, the on-voltage increases, and the change in the current division ratio caused by the voltage difference $\Delta$Vge is suppressed. Therefore, an improvement in the accuracy of current sensing can be expected.

It is needless to say that both the IGBT 1 and the free wheel diode 2 may be formed by the wide band gap semiconductor device.

[Use of RC-IGBT]

In the power modules 100 and 200 described with reference to the first and second preferred embodiments, a configuration in which the free wheel diode 2 is connected in reverse direction in parallel to the IGBT 1 is described. Alternatively, instead of the IGBT 1 and the free wheel diode 2, an RC-IGBT (Reverse Conducting Insulated Gate Bipolar Transistor) including an IGBT and a diode connected in reverse direction in parallel thereto in an integrated manner may be used.

Figure 13:
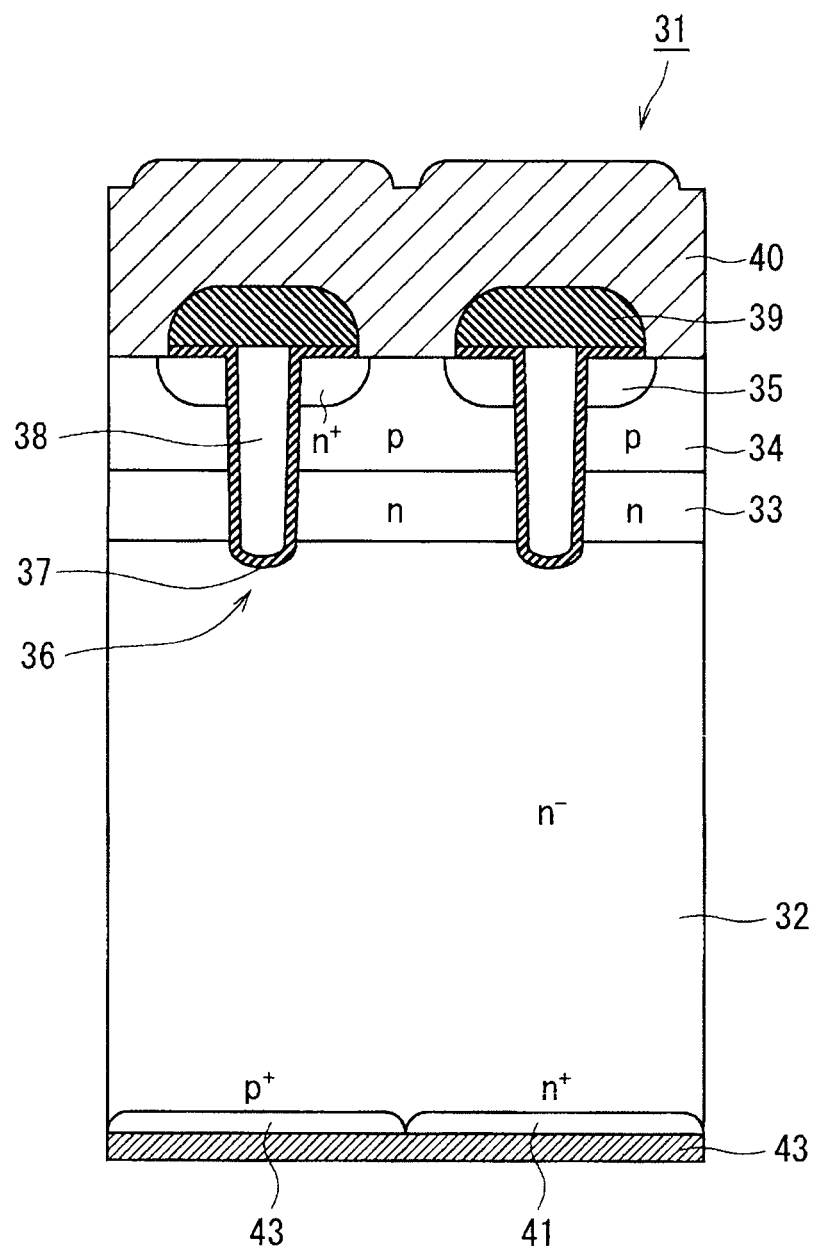
FIG. 13 is a cross sectional view illustrating a structure of an RC-IGBT.

Here, referring to FIG. 13, the structure of the RC-IGBT will be described. FIG. 13 is a cross sectional view of a semiconductor chip 31 incorporating therein an IGBT and a diode. The semiconductor chip 31 is formed by using an n substrate 32. An n-type impurity layer 33 containing n-type impurities is provided on the n$^-$ substrate 32, and a p base layer 34 containing p-type impurities is selectively provided thereon.

An emitter region 35 containing highly concentrated n-type impurities is selectively provided on the p base layer 34. A groove 36 is formed from the emitter region 35, while penetrating through the p base layer 34 and the n-type impurity layer 33, to the n$^-$ substrate 32. A gate insulating film 37 is formed on an inner wall of the groove 36, and a gate electrode 38 of polysilicon is formed further inside.

An interlayer dielectric film 39 is provided on the emitter region 35. An emitter electrode 40 is provided so as to make contact with parts of the emitter region 35 and the p base layer 34. An n$^+$ cathode layer 41 and a p$^+$ collector layer 42 are provided on a reverse side of the n$^-$ substrate 32. Further on the reverse side of these layers, a collector electrode 43 is formed. According to this structure, in a region where the n$^+$ cathode layer 41 is present, the diode is formed, and, in a region where the p$^+$ collector layer 42 is present, the IGBT is formed. In this way, the IGBT and the diode connected in reverse direction in parallel thereto are formed in an identical chip to thereby constitute the RC-IGBT.

The diode of the semiconductor chip 31 illustrated in FIG. 13 turns on when a voltage between the p base layer 34 and the n-type impurity layer 33 exceeds a built-in potential of the p-n junction. When the gate of the IGBT is turned on, the n-type impurity layer 33 and the emitter region 35 become conductive and have an identical potential. However, since the emitter region 35 shares a common contact area with the p base layer 34, it becomes difficult to apply a voltage to the p-n junction formed by the p base layer 34 and the n-type impurity layer 33 by turning the gate on. Accordingly, it becomes difficult for the holes to be injected into the p-n junction, and, as a result, a forward voltage drop (Vf) increases.

In this way, by using the RC-IGBT in which the IGBT and the diode are formed within an identical chip, the number of components further decreases as compared with the case where the IGBT and the diode are individually used, and easiness to produce the power module increases.

The RC-IGBT may be formed as a silicon semiconductor device, or, alternatively, may be formed as a silicon carbide semiconductor device or a gallium nitride semiconductor device.

While the invention has been shown and described in detail, the foregoing description is in all aspects illustrative and not restrictive. It is therefore understood that numerous modifications and variations can be devised without departing from the scope of the invention.

What is claimed is:

1. A power module comprising:
   a power switching semiconductor device provided with a main element and a current sense element, a main current flows through said main element, a part of said main current flows through said current sense element, and said current sense element of said power switching semiconductor device includes an output terminal from which a sense current is outputted;
   a current sensing circuit provided with a current sensing resistor and a first transistor, said first transistor includes a first main electrode connected to said output terminal of said current sense element of said power switching semiconductor device, one end of said current sensing resistor is connected to a second main electrode of said first transistor and another end of said current sensing resistor is connected to a common connection portion, said first transistor including a control electrode connected to a first reference potential;
   an overcurrent determination circuit that detects, as a current sensing voltage, a potential difference generated by said current sensing resistor based on said common connection portion as a reference, compares the potential difference with a predetermined threshold voltage, and determines whether or not an overcurrent flows through said power switching semiconductor device according to a magnitude relation between the potential difference and the predetermined threshold voltage; and
   a drive circuit that generates a control signal applied to a control electrode of said power switching semiconductor device.

2. The power module according to claim 1,
   wherein said first transistor corresponds to a transistor of a current mirror circuit that receives said sense current from said current sense element, and a mirror current of the current mirror circuit flows through the transistor,
   said current mirror circuit comprises a second transistor including a first main electrode connected to said output terminal of said current sense element, and a second main electrode connected to said first reference potential, and
   the control electrode of said first transistor and a control electrode of said second transistor are both connected to said first reference potential.

3. The power module according to claim 1,
   wherein said drive circuit comprises a first power source based, as a reference, on a second reference potential which is different from said first reference potential, and potential setting means that generates said second reference potential based on said first reference potential as a reference,
   said second reference potential is applied to said common connection portion,
   said potential setting means, while said first reference potential is set as a ground potential, applies a negative potential to said ground potential, and
   a positive bias and a negative bias are applied, as said control signal, to said control electrode of said power switching semiconductor device.

4. The power module according to claim 3,
   wherein said potential setting means applies, to the common connection portion, as said second reference potential, a negative potential obtained by dividing a potential of said first power source by resistors while said ground potential serves as a reference.

5. The power module according to claim 3,
   wherein said potential setting means applies the negative potential to said common connection portion as said second reference potential, the negative potential being defined by a Zener voltage of a Zener diode based on a potential of said first power source with said ground potential serving as a reference.

6. The power module according to claim 3,
   wherein said drive circuit further comprises a series connection of a diode element and a resistor connected in a forward direction with respect to said first reference potential between said first reference potential and said second reference potential, and
   said control electrode of said first transistor is connected to a connection node between said diode element and said resistor.

7. The power module according to claim 6,
   wherein said diode element is resulted from a diode-connected third transistor that is a transistor identical with said first transistor.

8. The power module according to claim 3,
   wherein a whole or a part of a drive control circuit including said drive circuit except for said current sensing circuit, said overcurrent determination circuit, and said first power source is formed as an integrated circuit.

9. The power module according to claim 4,
   wherein a whole or a part of a drive control circuit including said drive circuit except for said current sensing circuit, said overcurrent determination circuit, and said first power source is formed as an integrated circuit.

10. The power module according to claim 5,
    wherein a whole or a part of a drive control circuit including said drive circuit except for said current sensing circuit, said overcurrent determination circuit, and said first power source is formed as an integrated circuit.

11. The power module according to claim 6,
wherein a whole or a part of a drive control circuit including said drive circuit except for said current sensing circuit, said overcurrent determination circuit, and said first power source is formed as an integrated circuit.

12. The power module according to claim 7,
wherein a whole or a part of a drive control circuit including said drive circuit except for said current sensing circuit, said overcurrent determination circuit, and said first power source is formed as an integrated circuit.

13. The power module according to claim 1, further comprising a power diode connected in reverse direction in parallel to said power switching semiconductor device,
wherein said power diode is either a silicon carbide diode formed on a silicon carbide substrate or a gallium nitride diode formed on a substrate made of a gallium nitride based material.

14. The power module according to claim 1,
wherein said power switching semiconductor device is either a silicon carbide switching semiconductor device formed on a silicon carbide substrate or a gallium nitride switching semiconductor device formed on a substrate made of a gallium nitride based material.

15. The power module according to claim 1,
wherein said power switching semiconductor device comprises a reverse conducting insulated gate bipolar transistor including an insulated gate bipolar transistor and a diode connected in reverse direction in parallel thereto which are integrally formed on a semiconductor substrate, and
said reverse conducting insulated gate bipolar transistor is any one of a reverse conducting insulated gate bipolar transistor formed on a silicon substrate, a silicon carbide reverse conducting insulated gate bipolar transistor formed on a silicon carbide substrate, and a gallium nitride reverse conducting insulated gate bipolar transistor formed on a substrate made of a gallium nitride based material.

* * * * *